United States Patent [19]

Sato et al.

[11] Patent Number: 5,077,593

[45] Date of Patent: Dec. 31, 1991

[54] DARK CURRENT-FREE MULTIQUANTUM WELL SUPERLATTICE INFRARED DETECTOR

[75] Inventors: Robert N. Sato, Palos Verdes; Chan-Shin Wu, Torrance; Cheng P. Wen, Mission Viejo, all of Calif.

[73] Assignee: Hughes Aircraft Company, Los Angeles, Calif.

[21] Appl. No.: 457,613

[22] Filed: Dec. 27, 1989

[51] Int. Cl.$^5$ ............... H01L 27/14; H01L 31/06; H01L 29/205

[52] U.S. Cl. .................................. 357/30; 357/16; 357/4

[58] Field of Search ..................... 357/4, 16, 30

[56] References Cited

U.S. PATENT DOCUMENTS 4,598,164 7/1986 Tiedje et al. ................. 357/4

FOREIGN PATENT DOCUMENTS 0149178 7/1985 European Pat. Off. ............ 357/4
61-292382 12/1986 Japan ........................ 357/16

OTHER PUBLICATIONS

Das et al., *Appl. Phys. Lett.*, 51(15) Oct. 12, 1987, p. 1164, "Performance . . . Photodiode".

Primary Examiner—Jerome Jackson, Jr.
Attorney, Agent, or Firm—William J. Streeter; Wanda K. Denson-Low

[57] ABSTRACT

A multiquantum well superlattice photodetector for detecting long wavelength infrared radiation in which dark current is reduced by a blocking layer. The tunneling component of the dark current in a multiquantum well photodetector is substantially eliminated by placing a blocking layer at one end of the superlattice. The blocking layer has a potential energy barrier having a height at the same level of the barrier layers of the superlattice. The thickness of the blocking layer is substantially greater than the barrier layers of the superlattice to prevent charge carriers which tunnel through the superlattice from reaching the ohmic contact.

28 Claims, 3 Drawing Sheets

DARK CURRENT-FREE MULTIQUANTUM WELL SUPERLATTICE INFRARED DETECTOR

TECHNICAL FIELD

The present invention relates generally to photodetectors fabricated from semiconductor materials. More specifically, the present invention relates to a multiquantum well photodetector having a reduced dark current.

BACKGROUND ART

As will be appreciated by those skilled in the art, it is desirable to reduce the dark current output of a photodetector to improve the signal-to-noise ratio. In particular, it is known that the detection of long wavelength and low background infrared radiation is difficult due to the presence of a relatively large dark current. In addition to a reduction of the signal-to-noise ratio which reduces the sensitivity of the detector, high dark current also limits dynamic range and increases power dissipation. Power dissipation of semiconductor photodetectors is of considerable concern in the fabrication of focal plane arrays, since excessive heating requires additional device cooling.

Semiconductor photodetectors having multiple quantum wells in a superlattice structure are known in the art. A superlattice is typically fabricated using molecular beam epitaxy or metalorganic chemical vapor deposition to form a multilayered heterojunction structure. The thickness of each active layer is reduced to the order of carrier de Broglie wavelength such that two dimensional quantization occurs, resulting in a series of discrete energy levels. For example, a typical superlattice photodetector includes a plurality of alternating gallium arsenide (GaAs) and aluminum gallium arsenide (AlGaAs) layers. Each period of the superlattice comprises one GaAs layer and one AlGaAs layer. The GaAs layers are heavily doped n-type and comprise the quantum well layers which are interposed between AlGaAs barrier layers. The conduction band edge of the barrier layer material is above that of the conduction band edge of the quantum well layers, forming periodic quantum wells. The height of the energy barrier of the barrier layers can be varied by changing the ratio of aluminum-to-gallium to confine electrons at a selected energy level in the quantum wells.

In order to reduce thermionic emission of electrons from the quantum wells, superlattice devices of this nature are operated at temperatures based on a selected detection wavelength. An electrical bias applied perpendicular to the alternating barrier and quantum well layers in the absence of illumination produces a low current known as the dark current which results from quantum mechanical tunneling of electrons through the potential barriers of the barrier layers. However, when the superlattice is illuminated by photons of the appropriate energy, electrons are excited out of the quantum wells in response to the radiation by transitions between energy levels. These photoexcited electrons increase the conductivity of the device. Thus, it will be appreciated that these devices are in effect photoconductors and that a signal can be derived which is representative of the detected radiation.

One such device is disclosed in European Patent No. 275-150-A, wherein a photodetector having a superlattice defining multiple quantum wells is provided for infrared radiation detection. In this device, electrons in the quantum wells have two bound states. Incident infrared radiation produces intersub-band absorption between the ground state and the excited state. The applied bias, the height of the potential energy barriers of the barrier layers, and the spacing of the energy states in the quantum well layers are configured such that electrons in the excited state have a high tunneling probability. A signal current results from tunneling of the photoexcited electrons through the potential barriers of the barrier layers. In one embodiment, energy levels of neighboring wells are matched to optimize tunneling of photoexcited electrons while inhibiting dark current tunneling.

Other superlattice photodetectors have been designed which do not rely on photoexcited tunneling for the signal current. More specifically, it is known that quantum well structures have finite barrier heights and that permissible energy states exist above the potential barrier of the barrier layers, i.e., in the continuum state of the superlattice. B. F. Levine and others describe a photodetector of this type in an article entitled "High-Detectivity $D^* = 10^{10}$ cm $\sqrt{Hz}/W$ GaAs/AlGaAs Multiquantum Well $\lambda = 8.3$ $\mu$m Infrared Detector," App. L. Phys. Lett., 53(4), 25 July 1988. The detector comprises a 50 period GaAs/AlGaAs superlattice positioned between contact layers grown on a semi-insulating GaAs substrate. One advantage of these devices is the ability to control peak absorption wavelength by varying quantum well layer dimensions and barrier layer composition and thickness. The quantum wells contain a single bound state. By photoexciting the quantum well electrons into the continuum while the superlattice is appropriately biased, electrons travel above the superlattice potential barriers toward the collector, rather than through the barriers by quantum mechanical tunneling. Assuming an adequate mean-free path, the photoexcited carriers produce a signal representative of photon absorption in the quantum well layers.

Although multiple quantum well structures provide higher absorption efficiencies than single-well devices, a larger bias voltage is also required. This, in turn, increases the dark current produced by conventional superlattice photodetectors. The thermionic emission component of the dark current can be effectively minimized by operating these devices at low temperatures. However, it is known that the tunneling current, which is increased by sequential resonant effects and electron hopping, is the major component of the dark current. As stated, in applications requiring the detection of long wavelength and low background infrared radiation, the dark current is a significant problem in the operation of conventional multiquantum well photodetectors. Therefore, it is desirable to reduce the tunneling component of the dark current to increase the signal-to-noise ratio.

The solution proposed by others to reduce dark current in these devices is to increase the thickness of each of the barrier layers of the superlattice. Since photoconduction is not achieved through tunneling, thin barriers are not necessary from the standpoint of optimizing tunneling current. More specifically, in the aforementioned photodetector described by Levine and others, barrier layers of AlGaAs 300 angstroms in thickness and GaAs quantum well layers 40 angstroms in thickness were arranged to form a 50 period superlattice. By increasing the barrier width from 140 to 300 angstroms and the barrier height from 160 mV to 250 mV, the dark current was reduced by several orders of magnitude. This reduction in dark current resulted from a decrease in electron tunneling through the thick barrier layers. However, this method of decreasing the dark current suffers from several serious limitations.

Photodetector performance is based primarily on the quantum efficiency of the device, the response time and the sensitivity of the device. Although increasing the thickness of the superlattice barrier layers reduces dark current, it also limits the quantum efficiency of the detector. It will be appreciated that the mean-free path of electrons through the superlattice in a selected material system is essentially established by the bias voltage. Thus, if barrier layer thicknesses are substantially increased, as suggested, to significantly reduce the dark current, the periodicity number of the superlattice must be reduced to prevent recombination of the photoexcited electrons in the superlattice. As will be appreciated by those skilled in the art, in order for photoexcited charge carriers to be detected, they must have a mean-free path which is at least equal to the distance through the superlattice. If the mean-free path is less than this minimum distance, the photoexcited electrons will fall in the ground state of quantum wells in the superlattice or be trapped in the blocking or barrier layers prior to reaching the ohmic contact. Thus, either the number of superlattice layers must be decreased, resulting in fewer quantum well layers which reduces quantum efficiency, or the applied bias must be increased which in turn increases the tunneling current. In contrast to this prior art suggestion of increasing the thicknesses of the superlattice barrier layers, in the present invention, tunneling is prevented by a single, thick blocking layer positioned between the superlattice and the positively biased ohmic contact with respect to the other ohmic contact.

It should be noted that in U.S. Pat. No. 4,645,707, a semiconductor device is disclosed which includes two superlattices separated by a centrally disposed barrier layer which has a lower transmission coefficient than the barrier layers of the superlattices. It is stated that the central barrier layer is thicker than the barrier layers of the superlattices. The semiconductor device exhibits negative differential conductance due to voltage dependent discontinuities between energy minibands of the two superlattices. The device is a tunneling current device and is not a photodetector.

Accordingly, it is a primary object of the present invention to provide a multiquantum well photodetector having a low dark current.

Another object of the present invention is to provide a low dark current multiquantum well photodetector in which tunneling current is reduced or eliminated by means other than by increasing superlattice barrier layer thicknesses.

It is still a further object of the present invention to provide a multiquantum well photodetector which is particularly efficient in the detection of long wavelength and low background infrared radiation with virtually no power dissipation.

Still another object of the present invention is to provide a low dark current multiquantum well photodetector for use in infrared detector focal plane arrays.

SUMMARY OF THE INVENTION

Accordingly, the present invention provides in one aspect a photodetector which includes a plurality of quantum well layers and barrier layers arranged to form a superlattice. A blocking layer of barrier material is provided between the superlattice and the collector ohmic contact. The blocking layer has a predetermined thickness which substantially eliminates the tunneling current component of the photodetector dark current. The blocking layer thickness is substantially greater than the thickness of the individual barrier layers of the superlattice. By blocking tunneling current in this manner through the use of a single blocking layer, the thickness of which can be determined by the solution of the Schrodinger equation, the dark current is reduced without compromising the quantum efficiency of the detector.

The blocking layer of the present invention is preferably placed at the end of one multiquantum well superlattice structure, with the blocking layer and superlattice positioned between contact layers. One of the contact layers is in turn disposed on a semi-insulating semiconductor substrate which serves as an optical window to infrared radiation. Via the contact layers, and in accordance with the method of the invention, an electrical bias is applied to the photodetector across the contact layers perpendicular to the superlattice layers. Photons of the appropriate wavelength incident on the surface of the substrate are absorbed in the quantum well layers of the superlattice, causing photoexcitation of electrons confined in the quantum wells. These photoexcited electrons move to higher energy states in an energy continuum above the potential barriers of the barrier layers and the blocking layer where they move one mean-free path to the positively biased contact layer. The conductivity of the device is thereby increased by the presence of the photoexcited carriers in the continuum, producing a signal proportional to the photon absorption. Electrons tunneling through the barrier layers which would otherwise contribute to the dark current of the photodetector are blocked by the presence of the thick blocking layer. In this manner, the tunneling current component of the dark current is substantially eliminated.

DESCRIPTION OF THE PREFERRED EMBODIMENTS

Figure 1:
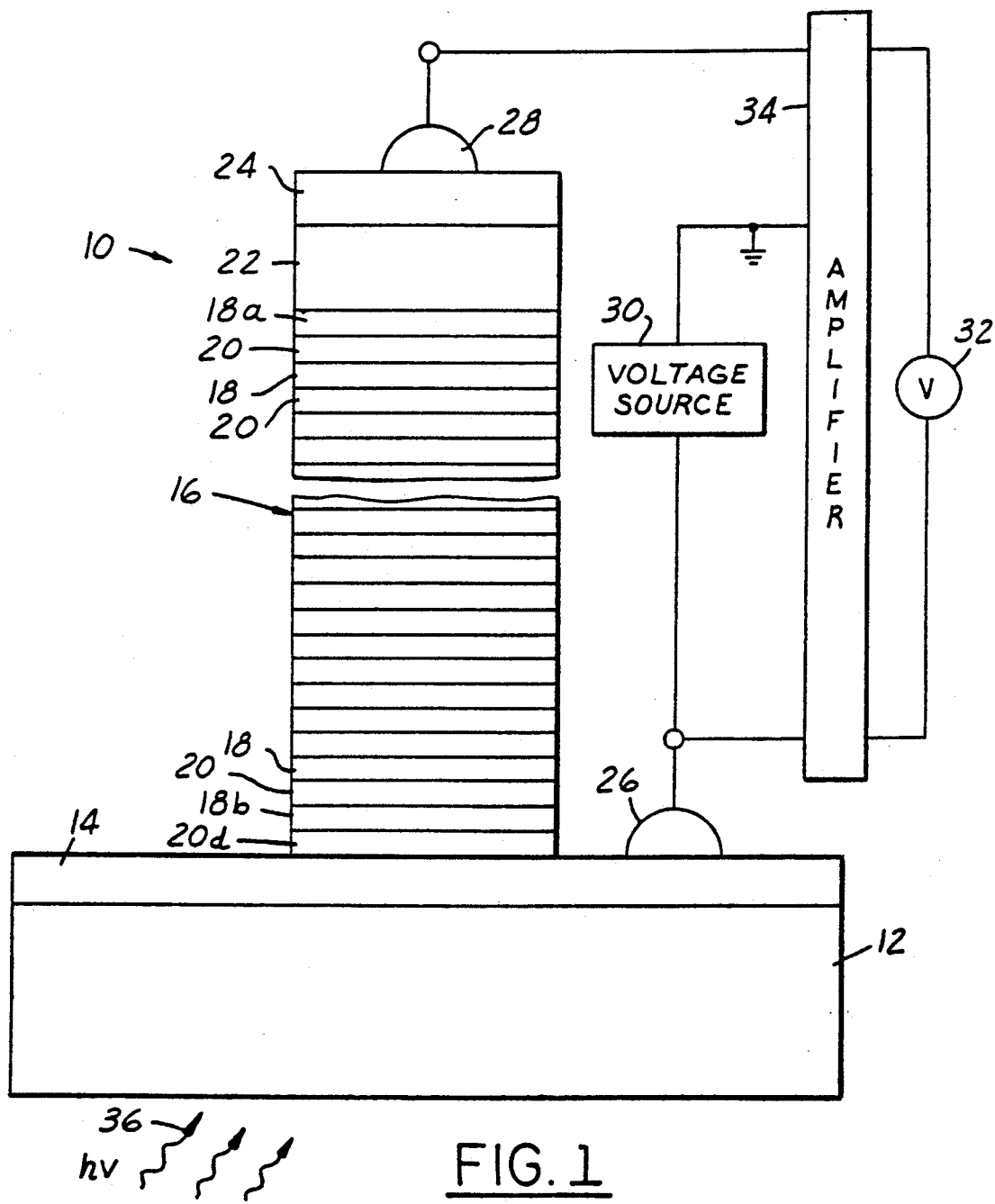
FIG. 1 is a schematic representation of a photodetector in accordance with the present invention.

Referring now to FIG. 1 of the drawings, photodetector 10 is shown comprising substrate 12 on which contact layer 14 is disposed. It should be noted that the figures are schematic, that they are not drawn to scale, and that like numerals designate like parts. The semiconductor material from which substrate 12 is fabricated permits travel therethrough of incident radiation of the wavelength to be detected. Due in part to superior lattice matching, the preferred materials for use in fabricating photoconductor 10 are gallium arsenide (GaAs) and aluminum gallium arsenide (AlGaAs), most preferably $Al_xGa_{1-x}As$ where x is between 0.2 to 0.3. Accordingly, substrate 12 preferably comprises semi-insulating GaAs. Contact layer 14 is heavily doped n-type GaAs such that the Fermi level lies within the conduction band of the material.

Figure 2:
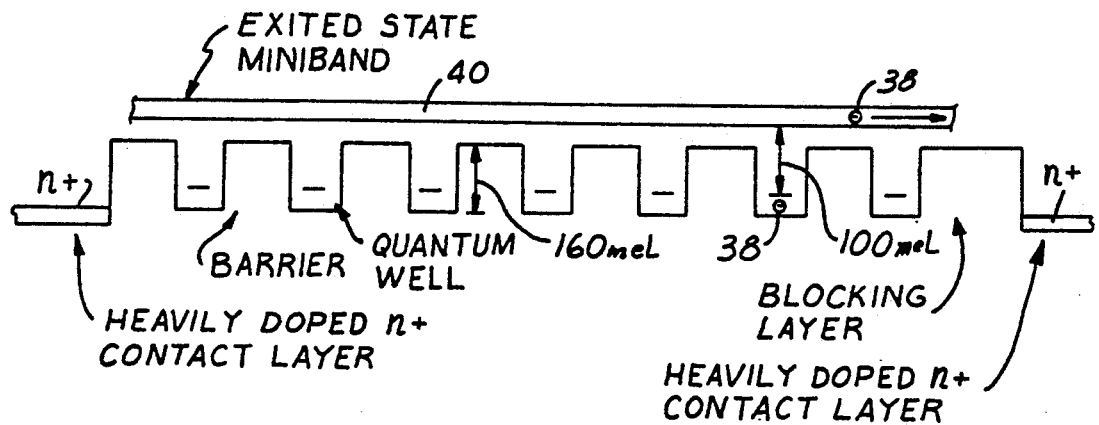
FIG. 2 is an example of a simplified partial energy band diagram for the detector illustrated in FIG. 1 with no applied bias.

As will be understood by those skilled in this art, the various semiconductor layers of photodetector 10 are epitaxial layers which are preferably formed by either molecular beam epitaxy or metal organic chemical vapor deposition. Superlattice 16 is shown disposed on contact layer 14 and comprises multiple heterostructure layers of semiconductor materials having alternating conductivities. More specifically, superlattice 16 includes a plurality of quantum well layers 18 interleaved between a plurality of barrier layers 20. As shown in FIG. 2 of the drawings which is a partial energy diagram of the conduction band edge of the various layers of photodetector 10, the conduction band edge of the barrier layers, i.e., the height of the potential energy barriers, is above the conduction band edge of the alternating quantum well layers. The thickness of each quantum well layer is sufficiently small, preferably from about 20 to about 60 angstroms, and most preferably about 40 angstroms, such that quantum effects are significant. The thickness of each barrier layer 20 is preferably from 40 to about 300 angstroms, and most preferably about 140 angstroms. Thus, the period of superlattice 16 is preferably about 180 angstroms in thickness.

In order to maximize the quantum efficiency of photodetector 10, it is desirable to provide as many quantum well layers 18 as possible. As will be explained more fully, photon absorption occurs in the quantum well layers and thus quantum efficiency is a function of quantum well layer number. However, the distance between last quantum well layer 18 and contact layer 24 ideally should not exceed the mean-free path of photoexcited electrons at the device operation voltage. As stated, in order for an excited electron to contribute to the signal it must reach the contact layer 24. Although only several periods are shown, it is most preferred that superlattice 16 comprise a 50 period structure. GaAs quantum well layers 18 are heavily doped n-type with a donor impurity such as Ge, S, Si, Sn, Te or Se. A particularly preferred dopant is Si at a concentration of about $1 \times 10^{18}$ to about $5 \times 10^{18}$ cm$^{-3}$, and most preferably about $2 \times 10^{18}$ cm$^{-3}$.

Figure 4:
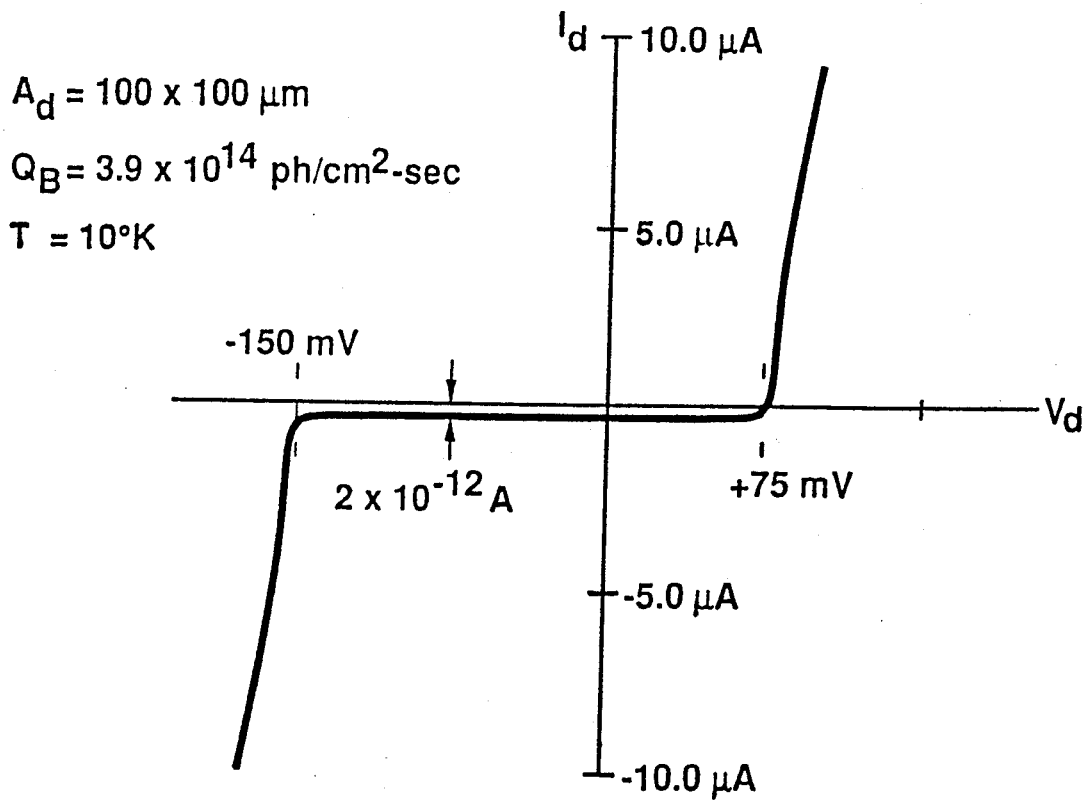
FIG. 4 is a current-voltage (I-V) curve plot of photovoltaic IR detection for a GaAs/AlGaAs MQW infrared detector.

As best shown in FIG. 2 of the drawings, in a preferred embodiment of photodetector 10, the potential barrier height of barrier layers 20 is about 160 meV above that of the quantum wells. It will be appreciated that the barrier width is small enough that there is a finite tunneling probability. A single bound state of electrons in the quantum wells is provided above the conduction band of the wells, but below the potential barriers of the barrier layers. In order to provide a periodic energy profile, the compositional and dimensional characteristics of the semiconductor layers which make up superlattice 16 are closely controlled and the superlattice periods are symmetrical. In this particular example, the energy gap between the bound state and the excited state of electrons in the quantum wells is 100 meV for absorption of long wavelength infrared radiation with peak detection of about 12 $\mu$m. Importantly, the first excited state of electrons in the quantum wells lies above the conduction band edge of the barrier layers. As explained in the background of the invention, by photoexciting electrons out of the quantum wells into the continuum level above the barrier, photoconduction distinct from the tunneling current is achieved. FIG. 4 shows remarkable measured low dark current characteristics of the multiquantum well photodetector of the present invention.

Although a GaAs/AlGaAs superlattice is particularly preferred in the present invention, other materials are also suitable. For example, it may be desirable to use materials such as InGaAs/InAlAs on InP, SiGe on Si, and HgCdTe. In general, superlattices fabricated from III-V, IV-IV and II-VI semiconductor materials are suitable for use in the present invention. Lattice match and thermal coefficient considerations, impurity concentrations, and fabrication techniques for use in the present invention will be understood by those of skill in the art. It is also to be understood that although the present invention is particularly suited for the detection of long wavelength and low background infrared radiation, photodetector 10 may be useful in the detection of shorter wavelength radiation. Further, it is contemplated that photodetector 10 may be useful in particle detection.

Referring again now to FIGS. 1 and 2 of the drawings, blocking layer 22 is seen interposed between outermost quantum well layer 18a of superlattice 16 and contact layer 24. In another arrangement, shown in FIG. 3, blocking layer 22 is positioned at the opposite end of superlattice 16. As will be described more fully hereinafter, in either embodiment blocking layer 22 provides the means by which dark current is significantly reduced in photodetector 10. Referring again to FIG. 1, contact layer 14 is heavily doped N-type and is shown in epitaxial contact with barrier layer 20d.

In order to apply an electrical bias across superlattice 16, a first terminal 26 and a second terminal or detector bias voltage terminal 28 are provided in ohmic contact with contact layers 14 and 24, respectively. Blocking layer 22 is formed of a material which is reasonably well lattice-matched with adjacent quantum well layer 18a of superlattice 16. Most preferably, blocking layer 22 is formed of the same material from which barrier layers 18 are formed, intrinsic Al$_x$Ga$_{1-x}$As in this particular embodiment. It is important that the conduction band edge of blocking layer 22 is lower than the miniband of excited states in the continuum such that electrons in the continuum can move through blocking layer 22 above its potential barrier as shown in FIG. 2. In the preferred embodiment, the conduction band edge of blocking layer 22 is at the same energy level as that of barrier layers 18. Although not shown in the drawings, if desired, a second blocking layer at the opposite end of the superlattice 16 may be provided such that the bias can be reversed while still blocking the tunneling current.

Importantly, blocking layer 22 is substantially thicker than each barrier layer 20. Blocking layer 22 should be at least 100 percent thicker than superlattice barrier layer 20. In this particular embodiment, it is preferred that blocking layer 22 have a thickness of approximately 500 to 2000 angstroms and most preferably approximately 800 angstroms.

It is the presence of this thick blocking layer 22 which reduces dark current in photodetector 10. The distance through blocking layer 22, i.e. the distance between quantum well layer 18a and contact layer 24 is sufficiently large such that electrons within the quantum wells cannot tunnel through the potential energy barrier of blocking layer 22 to reach contact layer 24. That is, blocking layer 22 is sufficiently thick such that substantially all electron tunneling through blocking layer 22 is prevented. It is to be understood that in the preferred embodiment blocking layer 22 comprises one wall of the last quantum well and can thus be thought of as part of the superlattice, or alternatively, as being positioned adjacent the end of superlattice 16. In any event, it is the placement of blocking layer 22 in the path of electron flow from quantum well layers 18 to terminal 28 which reduces dark current in the present invention. Although the thickness of blocking layer 22 is included in the total thickness or distance between quantum well layer 18b and contact layer 24 with respect to mean-free path considerations, by blocking the tunneling current with a single blocking layer 22, more efficient blocking of the tunneling current is achieved in less space than where tunneling is merely reduced by increasing the thickness of each barrier layer 20 as proposed in the prior art.

In operation, and in accordance with the method of the present invention, an appropriate detector bias voltage, typically positive and negative voltages near 0 volt as indicated in FIG. 4, is applied at terminal 26 by voltage source 30 to establish an electric field transverse or perpendicular to superlattice 16 in the direction of blocking layer 22. Terminal 28 is connected to a transimpedance amplifier 34, and its potential at terminal 28 is virtually 0 volt. The voltage at the output of the transimpedance amplifier is measured by voltmeter 32. The output voltage is proportional to the current generated by the detector. The transimpedance amplifier 34 serves to amplify the current generated by the detector and provide the voltage at the output. In order for the thermionic current to be lower than the photon background current, photoconductor 10 is preferably operated at a sufficiently low temperature.

Long wavelength infrared radiation 36 incident on substrate 12 travels through n+contact layer 14 into superlattice 16. As shown in FIG. 2, photons of the appropriate energy excite electrons 38 in quantum well layers 18 from their bound states to extended excited states in continuum 40. The mean-free path of electrons in the continuum is sufficiently large such that the electrons travel under the applied bias through superlattice 16 to contact layer 24 producing a photocurrent. The signal representative of the photocurrent is amplified by amplifier 34 and measured by voltmeter instrument 32.

The tunneling component of the dark current which would otherwise reduce the signal-to-noise ratio is effectively eliminated by the presence of blocking layer 22. More specifically, electrons which tunnel through the potential barriers of barrier layers 20, cannot tunnel through blocking layer 22 due to the width of its potential barrier. Since tunneling electrons do not reach contact layer 24, they do not contribute to the dark current. In this fashion, the tunneling current is effectively eliminated.

Figure 3:
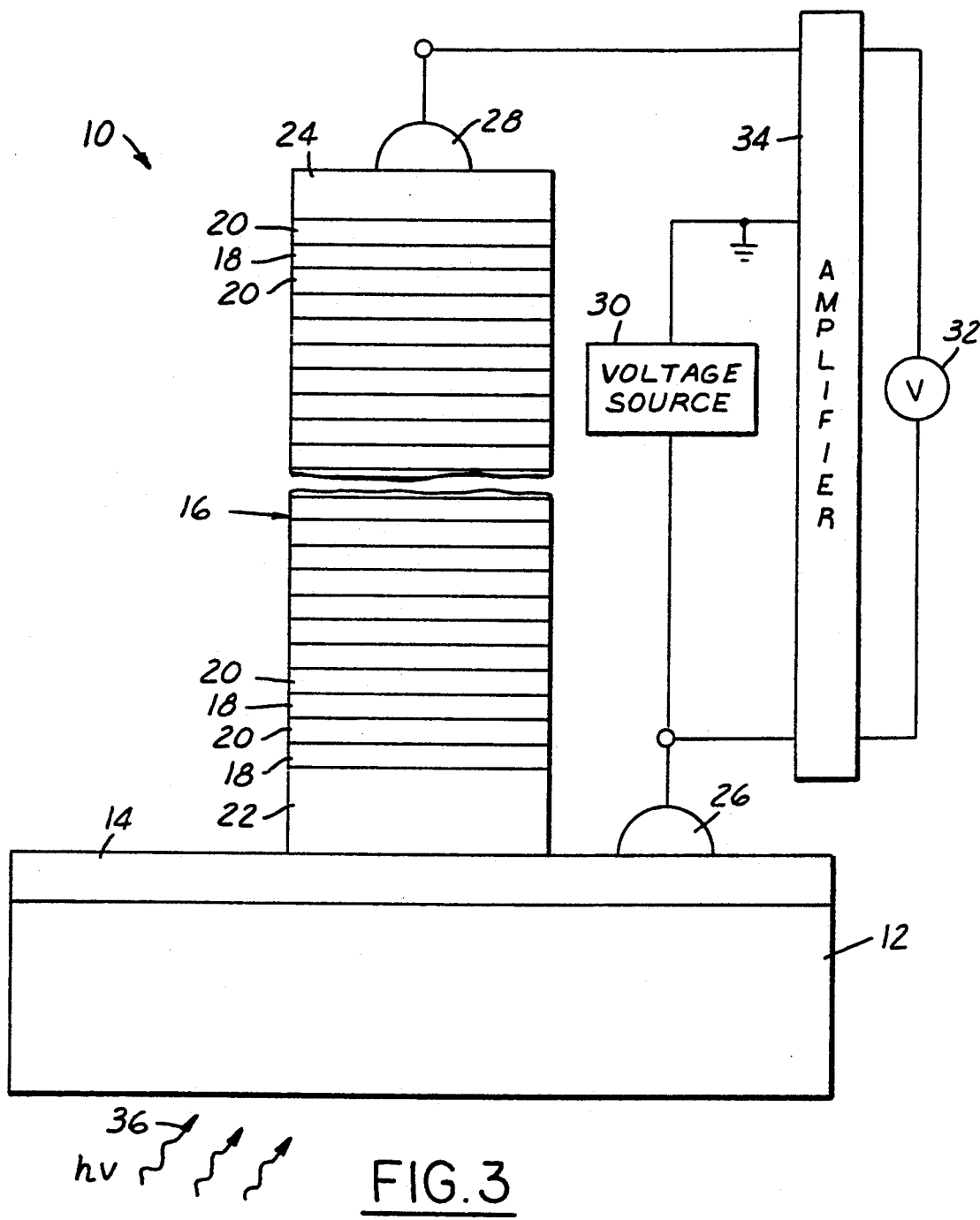
FIG. 3 is a schematic representation of the photodetector of the present invention in another embodiment.

The device shown in FIG. 3 functions in essentially the same manner; however, the bias is reversed such that photoexcited electrons are collected at contact layer 14, which is the standard approach.

Thus, the present invention provides a multiquantum well superlattice photodetector which blocks tunneling current in a manner which does not require any increase in the thickness of the individual barriers of the superlattice. In this fashion, quantum efficiency can be optimized by providing large period superlattice structures for maximum photon absorption. Due to the reduction of device dark current the signal-to-noise ratio is markedly improved. The present invention facilitates the design of photodetectors having large dynamic ranges and sensitivity. The decreased power dissipation of photodetector 10 also permits focal plane arrays to be constructed which do not produce excessive heat.

Thus, it is apparent that there has been provided in accordance with the invention a method and apparatus that fully satisfies the objects, aims and advantages set forth above. While the invention has been described in connection with specific embodiments thereof, it is evident that many alternatives, modifications, and variations will be apparent to those skilled in the art in light of the foregoing description. Accordingly, it is intended to embrace all such alternatives, modifications and variations that fall within the spirit and broad scope of the appended claims.

What is claimed is:

1. A semiconductor photodetector, comprising:
   a plurality of quantum well layers and barrier layers alternately arranged in a periodic superlattice structure to absorb photons, said quantum well layers having a thickness of from about 20 angstroms to about 60 angstroms and said barrier layers having a thickness of from about 40 angstroms to about 300 angstroms;
   a blocking layer at one end of said periodic superlattice structure, said blocking layer having a thickness of from about 500 angstroms to about 2000 angstroms; and
   said quantum well layers containing electrons having a bound state below the potential energy barriers of said barrier layers and said blocking layer and an excited state above said potential energy barriers of said barrier layers and said blocking layer, said thickness of said blocking layer being sufficient to prevent tunneling of electrons from said quantum wells through said potential energy barrier of said blocking layer.

2. The photodetector recited in claim 1, further including means for applying an electrical field across said periodic superlattice structure and said blocking layer.

3. The photodetector recited in claim 2, further including means of sensing an electrical signal in response to radiation incident on said superlattice structure.

4. The photodetector recited in claim 1, wherein said photodetector is an infrared photodetector and the energy gap between said bound state and said excited state is resonant with the energy of a preselected wavelength of infrared radiation.

5. The photodetector recited in claim 1, wherein said quantum well layers, said barrier layers, and said blocking layer are semiconductors compounds.

6. The photodetector recited in claim 5, wherein said quantum well layers are doped heavily n-type.

7. The photodetector recited in claim 5, wherein said semiconductor compound materials are selected from the group consisting of III-V, IV-IV and II-IV materials.

8. The photodetector recited in claim 1, further including a second blocking layer disposed at the end of said superlattice structure opposite said first blocking layer.

9. The photodetector recited in claim 2, wherein said biasing means induces the electrical field between first and second contact layers.

10. The photodetector recited in claim 9, wherein one of said contact layers is disposed on said blocking layer and further including a semi-insulating substrate on which said one of said contact layers is disposed.

11. The photodetector recited in claim 1, wherein said quantum well layers are GaAs, said barrier layers are AlGaAs and said blocking layer is AlGaAs.

12. The photodetector recited in claim 11, wherein said quantum well layers are doped n-type to between about $1\times 10^{18}$ cm$^{-3}$ and $5\times 10^{18}$ cm$^{-3}$.

13. The photodetector recited in claim 1, further including a plurality of said photodetectors arranged in a focal plane array.

14. The photodetector recited in claim 4, wherein said energy spacing between said bound state and said excited state is approximately 100 meV and said preselected wavelength of infrared radiation is 12 μm.

15. A low dark current infrared photodetector, comprising:
   a plurality of interleaved quantum well layers and barrier layers forming a multiquantum well superlattice structure, said quantum well layers each having a thickness of from about 20 angstroms to about 60 angstroms and said barrier layers each having a thickness of from about 40 angstroms to about 300 angstroms, said superlattice structure having a predetermined resistance to a preselected electrical bias applied across said superlattice in the direction transverse to said layers;
   charge carriers confined in quantum wells in said quantum well layers, said charge carriers being resonant with radiation having a preselected wavelength such that said charge carriers are excited out of said quantum wells to an energy level above the conduction band edge of said barrier layers to decrease the resistance of said superlattice structure; and
   a blocking layer disposed on one end of said superlattice structure, said blocking layer having a thickness of from about 500 angstroms to about 2000 angstroms which reduces tunneling of charge carriers in said superlattice to a greater extent than the individual barrier layers, thereby reducing said dark current of said photodetector.

16. The photodetector recited in claim 15, further including means for applying an electrical bias to said photodetector.

17. The photodetector recited in claim 15, further including means for sensing an electrical signal in response to radiation incident on said photodetector.

18. The photodetector recited in claim 15, wherein said preselected wavelength is long wavelength infrared radiation.

19. The photodetector recited in claim 15, wherein said quantum well layers, said barrier layers and said blocking layers are formed of compound semiconductor materials.

20. A semiconductor photodetector, comprising;
   a substrate of semi-insulating semiconductor material;
   a first contact layer of heavily doped n-type semiconductor material disposed on said substrate;
   a multiquantum well superlattice structure composed of a plurality of alternating quantum well layers and barrier layers disposed on said first contact layer, said quantum well layers having a thickness of from about 20 angstroms to about 60 angstroms and said barrier layers having a thickness of from about 40 angstroms to about 300 angstroms;
   a tunneling current blocking layer disposed on said multiquantum well superlattice, said blocking layer having a thickness of from about 500 angstroms to about 2000 angstroms;
   said quantum well layers containing electrons having a bound state below the potential energy barriers of said barrier layers and said tunneling current blocking layer and an excited state above said potential energy of said barrier layers and said tunneling current blocking layer, said thickness of said tunneling current blocking layer being sufficient to prevent tunneling of electrons from said quantum wells through said potential energy barrier of said tunneling current blocking layer; and
   a second contact layer of heavily doped n-type semiconductor material disposed on said tunneling current blocking layer.

21. The photodetector recited in claim 20, further including means for applying an electrical bias between said contact layers.

22. The photodetector recited in claim 20, further including means for sensing an electrical signal in response to radiation of a preselected wavelength incident on said substrate.

23. The photodetector recited in claim 20, wherein said quantum well layers are heavily doped n-type GaAs, said barrier layers are intrinsic AlGaAs and said blocking layer is intrinsic AlGaAs.

24. The photodetector recited in claim 20, wherein said quantum well layers are doped n-type to a concentration of from about $1\times 10^{18}$ to about $5\times 10^{18}$ cm$^{-3}$.

25. A semiconductor photodetector comprising;
   a substrate of semi-insulating semiconductor material;
   a first contact layer of heavily doped n-type semiconductor material disposed on said substrate;
   a tunneling current blocking layer disposed on said first contact layer, said blocking layer having a thickness of from about 500 angstroms to about 2000 angstroms;
   a multiquantum well superlattice structure composed of a plurality of alternating quantum well layers and barrier layers disposed on said tunneling current blocking layer, said quantum well layers having a thickness of from about 20 angstroms to about 60 angstroms and said barrier layers having a thickness of from about 40 angstroms to about 300 angstroms;
   said quantum well layers containing electrons having a bound state below the potential energy barriers of said barrier layers and said tunneling current blocking layer and an excited state above said potential energy barriers of said barrier layers and said tunneling current blocking layer, said thickness of said tunneling current blocking layer being sufficient to prevent tunneling of electrons from said quantum wells through said potential energy barrier of said tunneling current blocking layer; and
   a second contact layer of heavily doped n-type semiconductor material disposed on said tunneling current blocking layer.

26. The photodetector recited in claim 25, further including means for sensing an electrical signal in response to radiation of a preselected wavelength incident on said substrate.

27. The photodetector recited in claim 25, wherein said quantum well layers are heavily doped n-type GaAs, said barrier layers are intrinsic AlGaAs and said blocking layer is intrinsic AlGaAs.

28. The photodetector recited in claim 25, wherein said quantum well layer has a dopant concentration of from about $1\times 10^{18}$ to about $5\times 10^{18}$ cm$-3$.

* * * * *